(12) United States Patent
Afimiwala et al.

(10) Patent No.: US 10,145,021 B2
(45) Date of Patent: Dec. 4, 2018

(54) APPARATUS FOR PROCESSING MATERIALS AT HIGH TEMPERATURES AND PRESSURES

(75) Inventors: Kirsh Afimiwala, Shelton, CT (US); Larry Zeng, Strongsville, OH (US)

(73) Assignee: SLT TECHNOLOGIES, INC., Los Angeles, CA (US)

( * ) Notice: Subject to any disclaimer, the term of this patent is extended or adjusted under 35 U.S.C. 154(b) by 200 days.

(21) Appl. No.: 13/812,757

(22) PCT Filed: Jul. 28, 2011

(86) PCT No.: PCT/US2011/045708
§ 371 (c)(1),
(2), (4) Date: Jan. 23, 2015

(87) PCT Pub. No.: WO2012/016033
PCT Pub. Date: Feb. 2, 2012

(65) Prior Publication Data
US 2015/0122172 A1 May 7, 2015

Related U.S. Application Data

(60) Provisional application No. 61/368,443, filed on Jul. 28, 2010.

(51) Int. Cl.
*C30B 7/10* (2006.01)
*C30B 29/40* (2006.01)
(Continued)

(52) U.S. Cl.
CPC ............... *C30B 7/105* (2013.01); *C30B 7/14* (2013.01); *C30B 29/406* (2013.01);
(Continued)

(58) Field of Classification Search
CPC combination set(s) only.
See application file for complete search history.

(56) References Cited

U.S. PATENT DOCUMENTS

| 4,430,051 A * | 2/1984 | von Platen ................. B01J 3/06 |
| | | 117/224 |
| 4,606,037 A * | 8/1986 | Terashima .............. C30B 15/14 |
| | | 373/109 |

(Continued)

FOREIGN PATENT DOCUMENTS

| JP | 09-512385 | 12/1997 |
| JP | 2001-524249 | 11/2001 |

(Continued)

OTHER PUBLICATIONS

International Preliminary Report for International Application No. PCT/US2011/045708 dated Feb. 7, 2013.

(Continued)

*Primary Examiner* — Erin F Bergner
(74) *Attorney, Agent, or Firm* — Patterson & Sheridan, LLP

(57) ABSTRACT

An apparatus for processing materials at high temperatures comprises a high strength enclosure; a plurality of high strength radial segments disposed adjacent to and radially inward from the high strength enclosure; a liner disposed adjacent to and radially inward from the radical segments; a chamber defined interior to the liner; a heating device disposed within the chamber; and a capsule disposed within the chamber, the capsule configured to hold a supercritical fluid. The apparatus may be used for growing crystals, e.g., GaN, under high temperature and pressure conditions.

37 Claims, 5 Drawing Sheets

(51) Int. Cl.
  *C30B 7/14* (2006.01)
  *C30B 35/00* (2006.01)
(52) U.S. Cl.
  CPC ....... *C30B 35/002* (2013.01); *Y10T 117/1004* (2015.01); *Y10T 117/1008* (2015.01); *Y10T 117/1096* (2015.01)

(56) References Cited

U.S. PATENT DOCUMENTS

| | | | |
|---|---|---|---|
| 5,637,531 | A | 6/1997 | Porowski et al. |
| 7,704,324 | B2 | 4/2010 | D'Evelyn et al. |
| 2006/0177362 | A1 | 8/2006 | D'Evelyn et al. |
| 2009/0301387 | A1 | 12/2009 | D'Evelyn |
| 2011/0183498 | A1* | 7/2011 | D'Evelyn ................ B01J 3/008 438/478 |
| 2013/0263775 | A1* | 10/2013 | Pimputkar ................ C30B 7/10 117/71 |

FOREIGN PATENT DOCUMENTS

| | | |
|---|---|---|
| JP | 2006-513122 | 4/2006 |
| PL | 127099 | 4/1985 |
| PL | 147427 | 12/1989 |
| PL | 207400 B1 | 12/2010 |

OTHER PUBLICATIONS

Japanese Office Action for Japanese Patent Application No. 2013-521972 dated Mar. 3, 2015.

International Search Report for International Patent Application No. PCT/US2011/045708 dated Jan. 3, 2012.

International Search Report and the Written Opinion of the International Searching Authority, Momentive Performance Materials Inc., dated Jan. 3, 2012.

\* cited by examiner

APPARATUS FOR PROCESSING MATERIALS AT HIGH TEMPERATURES AND PRESSURES

CROSS-REFERENCE TO RELATED APPLICATION

This application claims priority to and the benefit of U.S. Provisional Patent Application No. 61/368,443, entitled "Apparatus for Processing Materials at High Temperatures and Pressures," filed on Jul. 28, 2010, and PCT Application No. PCT/US2011/045708 entitled "Apparatus for Processing Materials at High Temperatures and Pressures," filed on Jul. 28, 2011, both of which are incorporated herein in its entirety by reference.

GOVERNMENT SPONSORSHIP

This invention was made with United States government support awarded by the Department of Energy under Subaward Agreement for ARPA-E program DE-AR000020.

FIELD OF INVENTION

The present invention generally relates to an apparatus suitable for processing materials at high temperatures and pressures such as may be used, for example, crystal growth applications.

BACKGROUND

Growth of crystals, such as, for example, gallium nitride (GaN), may be accomplished via reactions and processing at high temperatures and/or high pressures. The reaction materials are generally placed inside a capsule, which is sealed and has an environment that is generally chemically inert and impermeable to solvents and gases that may be generated by the process or reactions occurring within the capsule. The capsule is subjected to high temperatures and the pressure in the capsule increases to the point that a material within the capsule forms a supercritical fluid, and crystal growth occurs under supercritical conditions. The pressure within the capsule may range anywhere from 1,000 pounds per square inch (psi) to 50,000 psi (about 70 bar to about 3,450 bar), and the temperature may range from about 300 to about 1,200 degrees Celsius. In some instances the pressure may need to be in the range of from about 70,000 to about 100,000 psi (about 4,800 bar to about 7,000 bar) and the temperature in the range of 500 to about 700 degrees Celsius to achieve commercially viable growth rates.

SUMMARY

The present invention provides an apparatus for processing materials under high temperature and pressure conditions and methods for making such materials. In one aspect, the present invention provides a reactor unit or system suitable for processing materials under high pressure and high temperature conditions such as, for example, the ammonothermal growth of bulk GaN crystals. The applicants have found a reactor configuration that can be scaled up and may sufficiently withstand the high pressures and temperatures that may be required to achieve commercially viable growth rates. While scalable to commercial/industry scales, the unit may still be kept relatively small compared to other known systems. Further, the present invention may allow for operating at higher temperatures and pressures compared to other known systems.

In one aspect, the present invention provides an apparatus comprising a pressure vessel, radial segments adjacent to and disposed radially inward from the pressure vessel, a liner adjacent to and disposed radially inward from the radial segments, and a chamber defined by the pressure vessel, radial segments, and liner. A heating device may be disposed within the chamber, and a capsule for conducting a reaction may be disposed within the chamber such that the heating device is disposed between the capsule and the liner.

In one aspect, the present invention provides an apparatus comprising a high strength enclosure; a plurality of high strength radial segments disposed adjacent to and radially inward from the high strength enclosure; a liner disposed adjacent to and radially inward from the radical segments; a chamber defined interior to the liner; a heating device disposed within the chamber; and a capsule disposed within the chamber, the capsule configured to hold reactants and materials for growing crystals under high temperature and pressure conditions; wherein there is a gap between the liner and an outer surface of the heating device.

In another aspect, the present invention provides an apparatus comprising a high strength enclosure; a plurality of high strength radial segments disposed adjacent to and radially inward from the high strength enclosure; a liner disposed adjacent to and radially inward from the radical segments; a chamber defined interior to the liner; a heating device disposed within the chamber, the heating device defining an outer surface, and inner surface, and cavity radially inward from the inner surface; and a capsule disposed within the chamber, the capsule configured to hold reactants and materials for growing crystals under high temperature and pressure conditions; wherein the capsule is disposed within the cavity of the heating device, and the capsule is configured such that there is a gap between an exterior surface of the capsule and the inner surface of the heating device.

According to one aspect, the liner comprises a high temperature steel or a high temperature metal alloy.

According to one aspect, the liner comprises a nickel-chromium based super alloy.

According to one aspect, the liner has a thickness of about 0.1 mm to 10 mm.

According to one aspect, the radial segments comprise a material chosen from a ceramic, a refractory metal, a cement, or a combination of two or more thereof.

According to one aspect, the radial segments comprise a material chosen from alumina, silicon nitride, silicon carbide, zirconia, tungsten, molybdenum, cobalt-cemented tungsten carbide, or a combination of two or more thereof.

According to one aspect, the radial segments have a wedge shaped structure.

According to one aspect, the apparatus comprises a pressure control device configured to adjust (a) a pressure within the capsule, or (b) a surrounding pressure of a pressurized gas within the high strength enclosure in response to sensed environmental conditions within the capsule or high strength enclosure.

According to one aspect, the sensor is configured to sense a pressure difference between an interior and an exterior of the capsule.

According to one aspect, the capsule has a first coefficient of thermal expansion, the sensor has a second coefficient of thermal expansion, and the second coefficient of thermal expansion is within 35%, 30%, 25%, 20%, 15%, 10%, 5%, or 1% or less of the first coefficient of thermal expansion. In still another aspect, the sensor physically engages the capsule.

According to one aspect, the capsule comprises a lid, and the lid is configured such that it has a first region having a first thickness, a second region having a second thickness that is less than the first thickness. In another aspect, the sensor is disposed on the lid of the capsule such that it overlies at least a portion of the second region having the second thickness.

According to one aspect, the apparatus comprises a displacement sensor configured to measure deformation of the capsule due to a pressure difference between the interior pressure of the capsule and the surrounding pressure.

According to one aspect, a sleeve is disposed about the outer surface of the heater. The sleeve may comprise a thermal insulating material. In other aspects, the sleeve may comprise pyrolytic boron nitride.

According to one aspect, the apparatus comprises a gallium nitride crystal, wherein the gallium nitride crystal is grown in super critical ammonia.

In still a further aspect, the apparatus may be utilized in a method of growing a crystal that comprises reacting a seed crystal and a nutrient material under temperature and pressure conditions sufficient to facilitate crystal growth. The method may comprise reacting the seed crystal and nutrient at a temperature of about 550° C. or greater and a pressure of about 5 kbar or greater.

These and further features of the present invention are further understood with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended thereto.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

It will be appreciated that the drawings are not to scale and are provided to illustrate aspects of the present invention. Objects and advantages together with the operation of the invention may be better understood by reference to the following detailed description taken in connection with the following illustrations.

DETAILED DESCRIPTION

Figure 1:
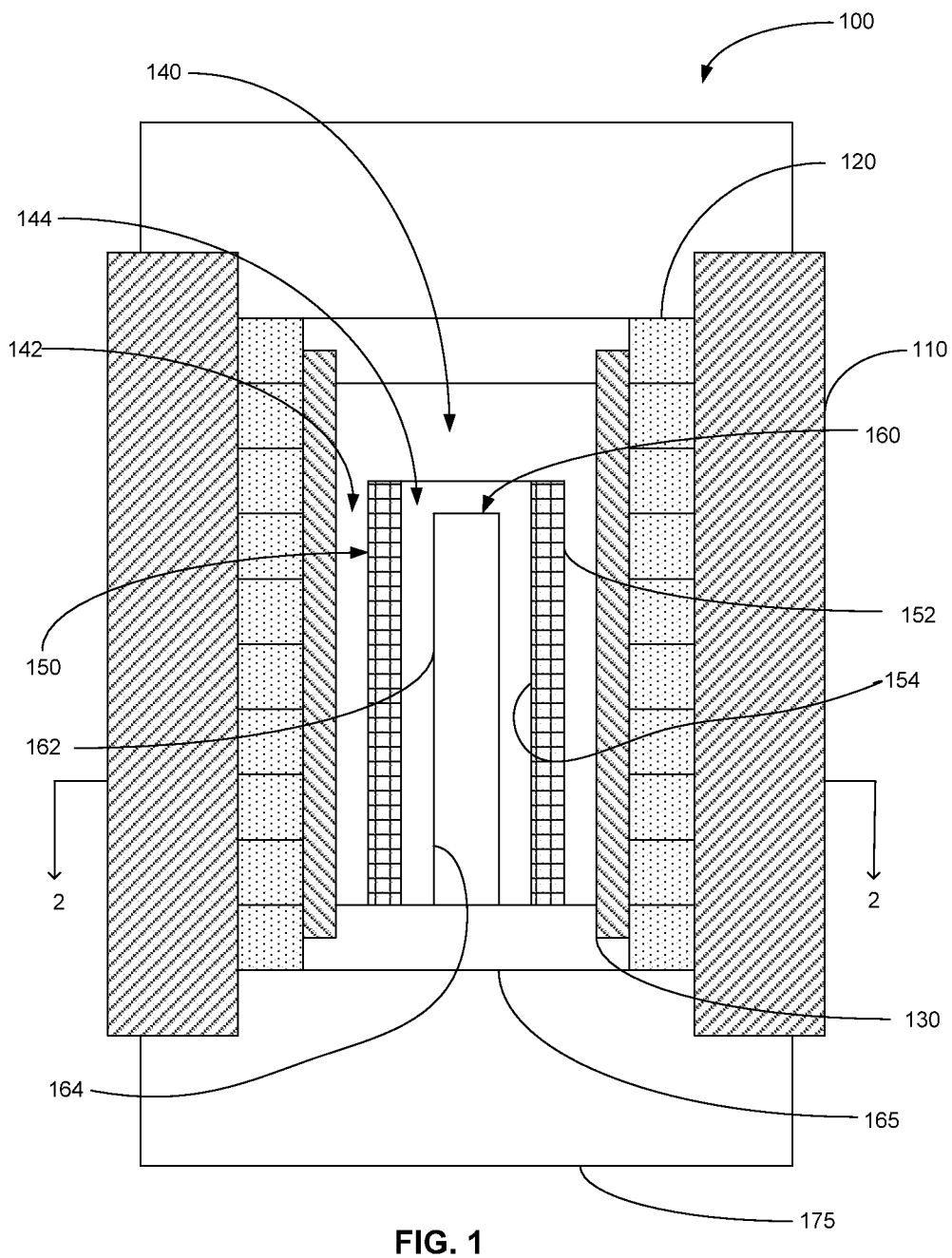
FIG. 1 is a cross-sectional plan view of an apparatus in accordance with one embodiment of the invention.
Figure 2:
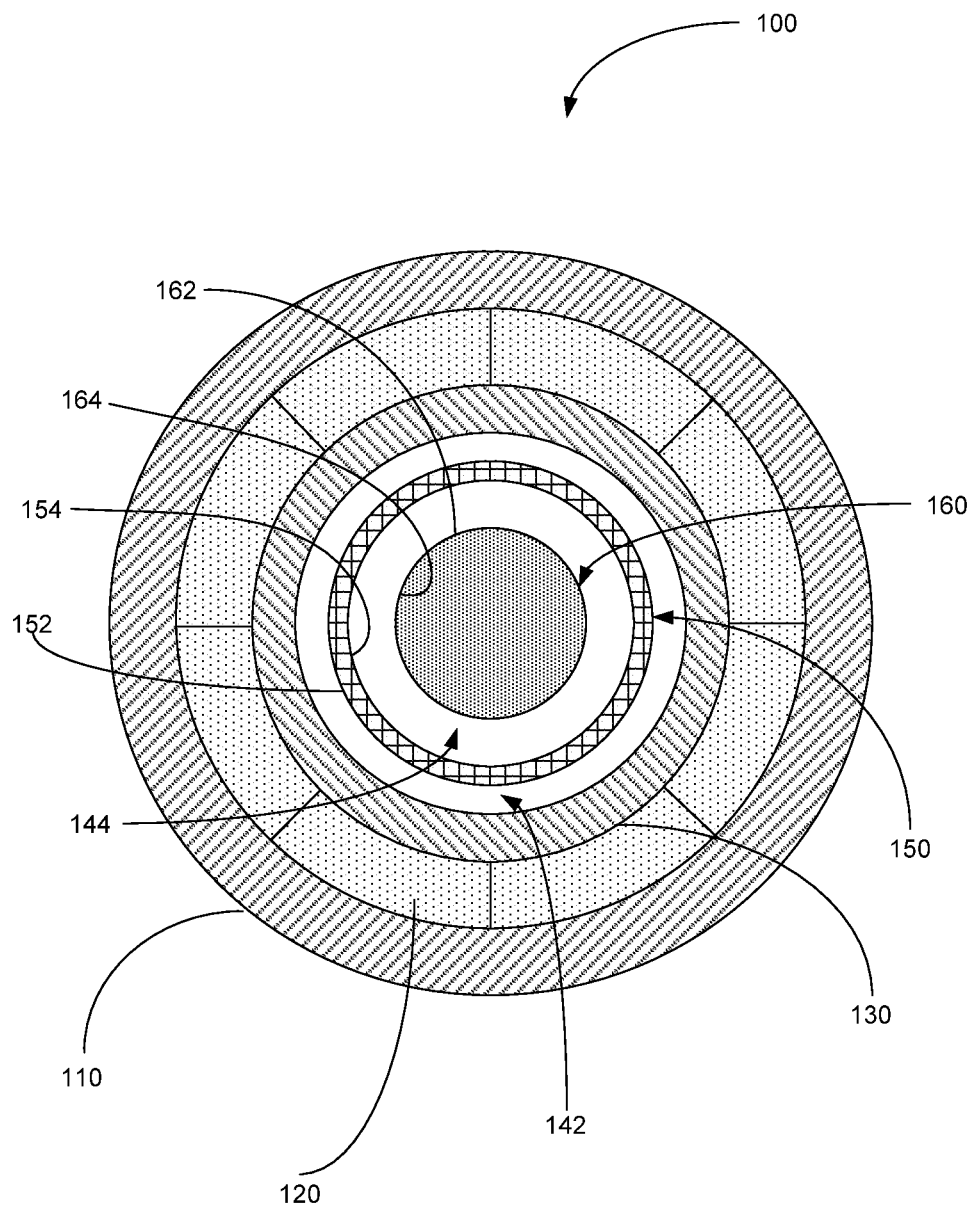
FIG. 2 is a cross-sectional top view of the apparatus of FIG. 1 taken along line 2-2.
Figure 3:
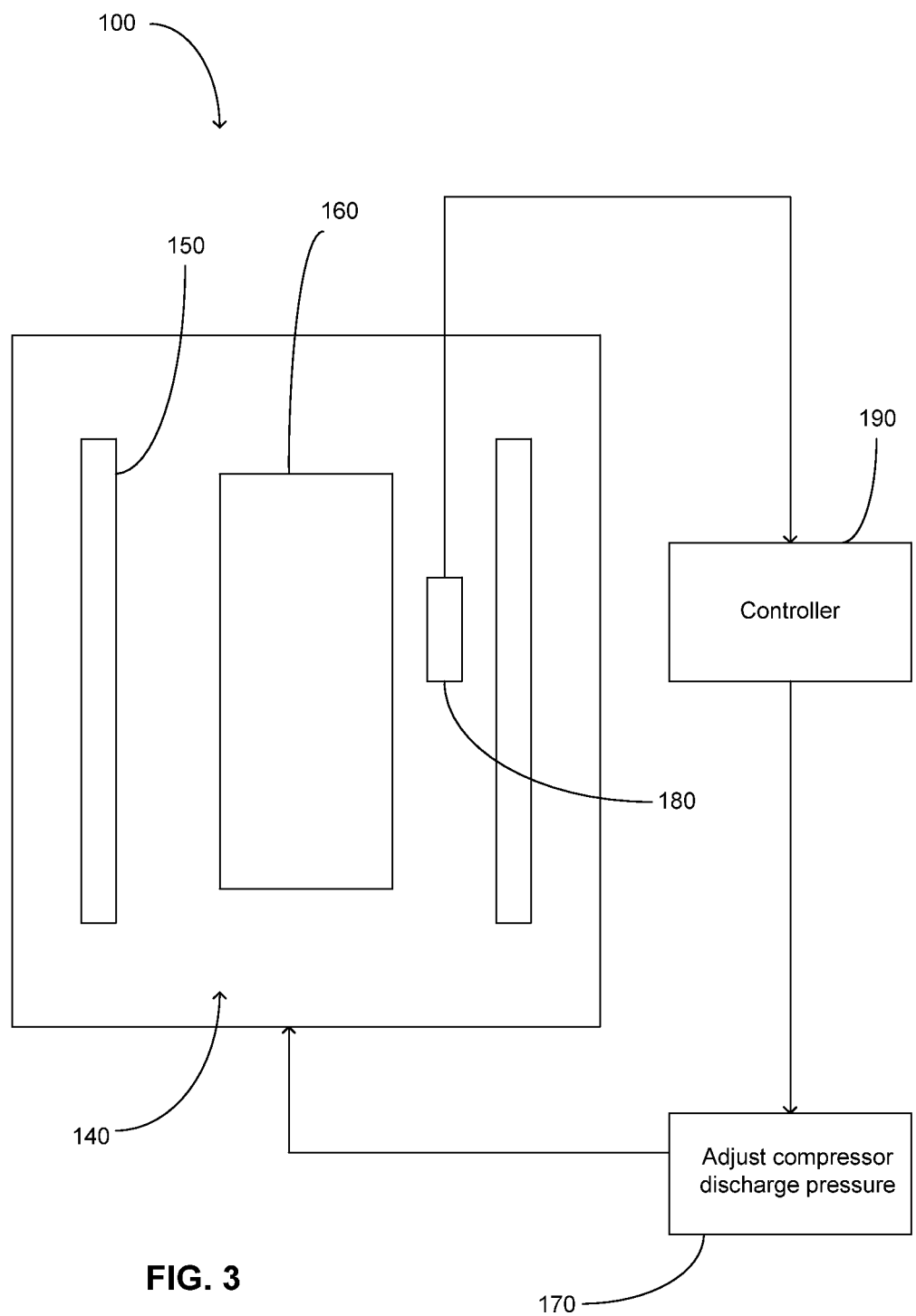
FIG. 3 is a schematic illustration of the reactor of FIG. 1 illustrating a control system for controlling the pressure of the reactor.

Referring to FIGS. 1 through 3, an apparatus 100 (which may be referred to herein as a reactor, reactor unit, reactor system, or the like) in accordance with an embodiment of the present is shown. The reactor system 100 comprises a pressure vessel 110, a plurality of high strength radial segments 120 disposed adjacent to and radially inward from the pressure vessel 110, and a liner 130 disposed adjacent to and radially inward from the radial segments 120. The pressure vessel, radial segments, and liner define a chamber or cavity 140 in the interior of the reactor system. The structure or configuration formed by the pressure vessel, radial segments, and the liner may be referred to herein as a containment structure, and generally define the reactor housing. The chamber 140 is adapted for receiving a capsule 160, which may be employed to carry out a reaction such as, for example, producing crystal materials such as, for example, gallium nitride (GaN).

Additionally, the reactor 100 comprises a heating device 150 disposed within the chamber 140. Generally, the heating device 150 is disposed within the chamber 140 such that there is a gap or clearance 142 between an outer surface 152 of the heating device 150 and the liner 130. The heating device 150 includes an inner surface 154 and defines an interior portion or cavity radially inward to the inner surface 154. The capsule 160 is generally disposed within the interior cavity of the heating device. In accordance with aspects of the invention, the capsule 160 may be sized and shaped such that there is a gap or clearance 144 between an exterior surface 162 of the capsule and the interior surface 154 of the heating device 150. The clearance 144 between the capsule and the heating device may be provided such that the clearance is large enough to allow for expansion of the capsule due to the increase of pressure and temperature within the capsule, but small enough to impede convection heat transfer in the reactor.

Seal caps 165 may be secured to the apparatus at each end of reactor to seal the system. For example, as shown in FIG. 1, end caps 165 are disposed at the ends of the pressure liner 130 and radial wedges 120 to provide a closed/sealed environment surrounding the capsule and seal the contents within the chamber 140. The system may further include end plates 175 secured to the end of the system.

The reactor system 100 allows for the heat and pressure developing inside the capsule 160 to be controlled to ensure a desired temperature distribution inside the capsule 160 and to ensure relatively uniform pressures between the inside of the capsule 160 and the exterior of the capsule 160. In certain embodiments, the capsule 160 is self-pressurizing by heat or chemical reactions, for example, via the equation of state of ammonia or water for crystal growth of gallium nitride or quartz, respectively. For example, the heating device 150 functions to raise the temperature inside the capsule 160, thereby causing the substances disposed within the capsule 160 to expand and, thus, raise the pressure within the capsule 160.

As shown in FIG. 3, the reactor system includes a gas pressure regulator 170 (e.g., a compressor) to counteract this internal pressure within the capsule 160. The gas pressure regulator 170 pumps a high-pressure gas, such as argon or another inert gas, into the reactor system 100 and chamber 140 (including the gap or clearance 144) to pressurize the closed/sealed environment surrounding the capsule 160. The apparatus 100 comprises one or more sensors 180, which are configured to sense a pressure difference between an interior and an exterior of the capsule 160. The type of sensors employed in the system may be selected as desired for a particular use intended application. For example, pressure sensors may be used to sense external and internal pressures, which are then used to calculate the pressure difference. In another embodiment, displacement sensors may be used alone to calculate deformation of the capsule 160, and the capsule deformation can be used to calculate the pressure difference. In another embodiment, a pressure sensor may be used to sense an internal pressure of the capsule, which is then compared with an external or surrounding pressure measured by an exterior pressure sensor.

The apparatus 100 includes a pressure control device 190 configured to adjust the pressure difference (i.e., reduce, minimize, or eliminate) between the capsule 160 and the closed/sealed environment in the containment system in response to the pressure difference sensed by the one or more sensors. Typically, during operation of the system, the pressure within the capsule ranges from about 10,000 psi to about 150,000 psi (about 700 bar to about 10,500 bar) and the temperature may range from about 300 degrees Celsius to about 1,200 degrees Celsius. In one embodiment, the apparatus is configured to increase the operating conditions within the capsule to a temperature of about 550 degree Celsius and a pressure of about 5,000 bar (5 kbar). In other embodiments of the present technique, the pressure may range to above 150,000 psi (about 10,500 bar or 10.5 kbar) and the temperature ranges to above 1,500 degrees Celsius. Here as elsewhere in the specification and claims, numerical values may be combined to form additional and/or non-disclosed ranges. The pressure control device 190 is configured to balance an interior pressure within the capsule 160 with an external or surrounding pressure of the pressurized gas within the pressure vessel in response to sensed environmental conditions within the capsule or the pressure vessel. As discussed above, these sensed environmental conditions may include an internal pressure, an external pressure, a deformation of the capsule 160, a temperature inside and/or outside of the capsule, and different combinations thereof.

In one embodiment of the illustrated technique, the sensor 180 comprises a displacement measuring device, such as a capacitance displacement transducer, configured to measure displacement or deformation of the capsule 160 due to the expansion or contraction of the capsule 160 caused by the difference in pressure between the exterior and the interior of the capsule 160. In another embodiment, the sensor 180 may comprise a strain gauge configured to measure displacement or deformation of the capsule 160 due to the expansion or contraction of the capsule 160, which expansion or contraction results from the difference in pressure between the exterior and the interior of the capsule 160. In response to a measured displacement of the capsule 160, the pressure control device 190 correlates that deformation to an internal pressure of the capsule 160 and adjusts the internal pressure within the capsule 160 and/or the surrounding pressure in the closed/sealed environment via the gas pressure regulator 170 to balance the internal and surrounding pressures, thereby substantially eliminating the pressure difference and preventing further displacement of the capsule 160. It will be appreciated that a variety of sensors are within the scope of the present technique. The pressure control device 190 may comprise software, hardware, or suitable devices to monitor the pressure differences and to control the gas pressure intensifier 170 such that the surrounding pressure within the closed/sealed environment is substantially equal to the pressure inside the capsule 160. In this manner, the capsule 160 can withstand relatively higher internal pressures, thereby facilitating processing of materials with supercritical fluids.

A sensor may be configured to disposed on an outer surface of the capsule to detect and measure the displacement or deformation of the capsule. In one embodiment, the capsule and sensor are configured such that the capsule and sensor have similar coefficients of thermal expansion so they will expand or contract at similar rates when the apparatus is operated under the selected high temperature and pressure conditions to carry out the desired reaction within the capsule. In one embodiment, the capsule has a first coefficient of thermal expansion, the sensor has a second coefficient of thermal expansion, and the second coefficient of thermal expansion is within about 35% of the first coefficient of thermal expansion. In another embodiment, the second coefficient of thermal expansion is within about 30% of the first coefficient of thermal expansion. In still another embodiment, the second coefficient of thermal expansion is within about 25% of the first coefficient of thermal expansion. In other embodiments, the second coefficient of thermal expansion is within 20%, 15%, 10%, 5%, or 1% or lower of the first coefficient of thermal expansion. In one embodiment, the second coefficient of thermal expansion is from about 0.1% to about 35% of the first coefficient of thermal expansion. In another embodiment, the second coefficient of thermal expansion is from about 1% to about 25% of the first coefficient of thermal expansion. In still another embodiment the second coefficient of thermal expansion is from about 5% to about 15% of the first coefficient of thermal expansion. Here as elsewhere in the specification and claims numerical values can be combined to form additional and/or non-disclosed ranges.

The sensor may also comprise a high temperature connector for attachment to the necessary electronic equipment and components for sensing the pressure within the capsule. The high temperature connector may be configured to allow for the sensor to be disconnected from the electronic components and allow for the capsule to be opened and closed and the components disconnected from one another without damaging the sensor.

Figure 4:
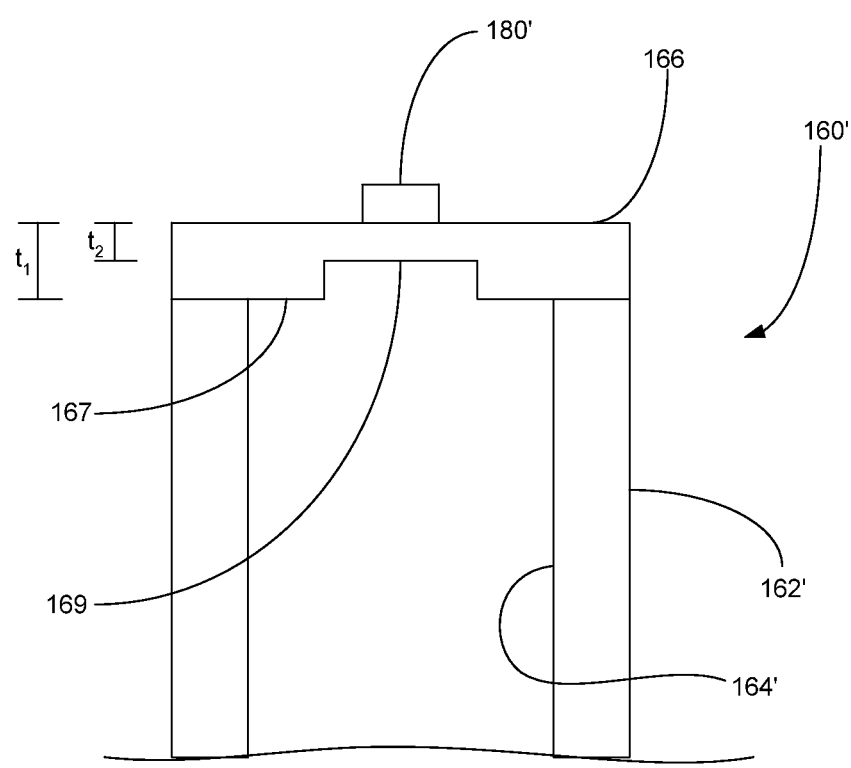
FIG. 4 is a partial cross-sectional plan view of a capsule in accordance with one embodiment of the invention.

The capsule lid may be optionally configured to allow for the evaluation of the pressure inside the capsule. In one embodiment, illustrated in FIG. 4, the capsule 160' includes an outer surface 162', an inner surface 164', and a lid 166 that is configured such that the lid 166 has first regions 167 with a first thickness ($t_1$) and a second region 169 of a second thickness ($t_2$) that is less than the first thickness. When a sensor is disposed on a surface of the capsule, the sensor may be disposed such that it at least partially overlies the second region having a reduced or smaller thickness. Referring to FIG. 4, for example, a sensor 180' may be disposed on the lid 166 such that it overlies region 167 having the reduced thickness.

In alternative embodiments, the pressure difference may be substantially eliminated or minimized by simultaneously controlling the temperature and pressure in tandem within the capsule 160. Regarding the control of temperature in the system, the apparatus may include a plurality of temperature sensors situated proximate to, and optionally in direct contact with, the capsule 160 for monitoring the temperature distribution of the capsule 160. In addition, temperature sensors may be positioned both inside and outside of the capsule 160 to facilitate control of the internal and external/ surrounding conditions (e.g., temperature, pressure, etc.) of the capsule 160. Non-limiting examples of suitable temperature sensors may include a thermocouple, a thermistor, an optical fiber coupled to an optical pyrometer, or any combination thereof. The temperature sensors may be coupled to a temperature control device, which monitors and controls the temperature distribution of the capsule 160. In certain embodiments, the temperature control device and the pressure control device 190 cooperate to provide a desired temperature and pressure within the capsule 160 (and optionally surrounding the capsule 160), while ensuring that the pressure differentials between the interior and exterior of the capsule 160 are substantially minimized. Moreover, the temperature sensors may be placed in a plurality of different zones, such as hot zones, around the exterior of the capsule 160, such that the temperature control device can monitor and adjust temperature variations across these different zones. For example, the temperature control device may independently control different elements or portions of the heating device 150 in response to temperatures sensed in the different zones surrounding the capsule 160, thereby facilitating a balanced or desired temperature profile within the capsule 160. In one embodiment of the present technique, a central controller, computer, control circuitry, or control system may couple the pressure control device 190 and the temperature control device, thereby simultaneously or centrally controlling the temperature and pressure associated with the capsule 160.

In still another embodiment, the balance of pressure between the inside and outside of the capsule 160 may be achieved by a self regulating mechanism. In such an embodiment, the pressure may be regulated without measuring either the pressure inside capsule or the displacement of the capsule body. A controlled pressure and temperature ramp in the space 140 (including gap or area 144) based on the equation of state provides an approximation of pressure balance, and the exact balance is achieved by the self regulating mechanism. For example, the capsule 160 may be configured with one or more valves for allowing gases to enter or exit the capsule. When the internal pressure of the capsule is higher than the external pressure, the valve is opened and allows a small amount of supercritical fluid to bleed into the chamber 140. When the internal pressure is lower, the valve allows the pressurizing gas in the chamber (e.g., Ar or $N_2$) to enter the capsule.

Under processing conditions, the pressure in the interior of the capsule 160 reaches an elevated pressure when its temperature is raised to a predetermined value by directing electrical power to the heating device 150. If the equation of state of the material in the capsule 160, that is, the pressure as a function of temperature and fill factor, is accurately known, the pressure in the high strength enclosure may be ramped in tandem with the increase in temperature so that the gas pressure in the closed/sealed environment is approximately equal to the pressure in the interior of the capsule 160. If this condition is not held, the capsule 160 will be crushed or will burst, depending on whether the exterior pressure exceeds the interior pressure or vice versa. Again, the pressure control device 190 ensures that the pressures inside and outside of the capsule 160 are substantially balanced during a particular process, thereby preventing undesirable deformations of the capsule 160 and facilitating much greater pressure ranges for the particular process.

For some types of supercritical fluid processing at high pressure and high temperature, a temperature gradient between two chambers of the capsule 160 is desired. For example, crystal growth is among those applications in which a temperature gradient is sometimes desirable. In certain applications of crystal growth, the vapor pressure of the solvent increases as the capsule 160 is heated. The vapor pressure of the solvent at a given temperature and quantity of solvent present within the capsule 160 can be determined from the phase diagram of the solvent. At a sufficiently high temperature and pressure, the solvent becomes a supercritical fluid. As explained above, as the internal pressure of the capsule 160 increases, the walls of the capsule 160 may deform outward.

In order to protect the capsule 160 from bursting due to over pressure, the pressure control device 190 functions to adjust the pressure in the closed/sealed environment. For example, the deformation of the capsule 160 can be measured by the sensor 180, which provides a signal to the pressure control device 190. In some embodiments, sensors may be provided inside and outside of the capsule 160 to measure the internal and external pressures, which are then used to identify the pressure difference between the inside and outside. In turn, the pressure control device 190 provides signals to the gas pressure intensifier 170 to regulate the flow of gas to the capsule 160, thereby protecting the capsule 160 from bursting. In other words, if the interior pressure begins to exceed the exterior pressure causing the capsule 160 to deform outward, then one or more of the sensors 180 indicates an internal-external pressure difference (or physical displacement/deformation) that triggers pressure adjustment by the pressure control device 190. For example, the one or more sensors 180 may provide a signal to the pressure control device 190, which causes the gas pressure intensifier 170 to increase the exterior gas pressure to minimize or eliminate the internal-external pressure difference. Conversely, if the exterior pressure begins to exceed the interior pressure, causing the capsule 160 to deform inward, then the one or more sensors 180 transmit a signal to the pressure control device 190, which reduces the exterior gas pressure to minimize or eliminate the internal-external pressure difference. For example, the system may reduce the pumping of the gas pressure intensifier 170 or open a valve (not shown) to release some pressure.

The system 100 includes a variety of features to improve processing of substances at or above a supercritical point. For example, the system 100 is configured to control temperature and pressure in a more uniform manner, thereby substantially improving conditions for materials processing inside the capsule 160 and for reducing stress on the walls of the capsule 160. Moreover, the system 100 is configured to improve heat and flow distribution throughout different regions of the capsule 160, thereby further improving conditions for materials processing inside the capsule 160. Applicants have found that the combination of a configuration adapted for controlling or adjusting the pressure surrounding the capsule (provided by the chamber defined by the liner) in conjunction with the use of radial wedge segments adjacent the pressure vessel provides a reactor suitable for high temperature and high pressure processing of materials and particularly suitable for extremely high pressures and high temperatures including above 5,000 bar and 550° C., and even about 100,000 psi (about 7,000 bar) or greater. The disclosed configuration may be provided on an industrial size scale. Applicants have surprisingly found, however, that a configuration in accordance with the present disclosure, while scaleable to a commercial/industrial scale, may still be kept relatively small as compared to other systems such as a system that controls the expansion of the capsule by either (i) regulating the pressure exterior to the capsule alone, or (ii) employing radial wedge segments alone. Systems that are configured to regulate the pressure surrounding the capsule alone may require very large and thick pressure vessels, especially for operating at extremely high pressures (e.g., greater than 70,000 psi (about 4,800 bar)). Systems employing the radial wedge segments alone to control the capsule expansion require very tight tolerances and adjacent components must be in essentially surface-to-surface contact with each other through out the entire length of the structure, which is difficult to achieve when scaled up to the sizes required to provide commercially viable crystal growth at extremely high pressures. A reactor in accordance with the present disclosure, however, is scaleable to meet industrial requirements but may still be kept relatively small (even though operating at extremely high pressures).

The pressure vessel 110, which may be referred to herein as a high strength enclosure/high strength apparatus, may be constructed from a high strength material, such as SA723 or another high strength steel, to support high pressures (e.g., 15,000 psi to about 150,000 psi about 1,050 to about 10,500 bar)) within the closed/sealed environment.

The apparatus 100 further includes radial segments 120 comprising a hard material that undergoes little or no deformation under operating conditions. The high strength pressure vessel 110 and the radial segments 120 cooperate to withstand and counteract the pressures building inside the capsule 160 during a particular process. The segments 120 may comprise a ceramic, such as alumina, silicon nitride, silicon carbide, zirconia, or the like. The segments 120 may alternatively comprise a refractory metal, such as tungsten, molybdenum, or TZM alloy, or a cermet, such as Co-cemented tungsten carbide. The material and wedge-shaped geometry of the radial segments 120 are configured to reduce the pressure transferred from the chamber 140 to the pressure vessel 110. In other words, the wedge-shaped radial segments 120 spread the load applied by the capsule 160 over the area on an inner diameter of the segments 120 over a larger area on the inner diameter of the pressure vessel 110, such that the pressure vessel 110 bears a relatively smaller pressure at an interface between the radial segments 120 and the pressure vessel 110. For these reasons, the radial segments 120 cooperate with the pressure vessel 110 to counteract the pressures inside the capsule 160, thereby balancing the forces inside and outside of the capsule 160. As a result, the apparatus is capable of withstanding relatively higher internal pressures and, thus, a wider range of supercritical fluid processing conditions.

The apparatus further includes a liner 130 disposed adjacent to the radial segments 120. Since the disclosed apparatus contains gaps between the capsule and the radial segments, the liner is employed to provide a seal within the system. The liner may be a high temperature material such as, for example, a high temperature seal or a high temperature metal alloy. A non-limiting example of a material suitable for the liner is a nickel-chromium based alloy. Non-limiting examples of suitable nickel-chromium based alloys include Inconel® metals such as, for example, Inconel 718. The thickness of the liner is not particularly limited and may be chosen as desired for a particular application or intended use. In one embodiment, the liner may have a thickness of from about 0.1 mm to about 10 mm or from about 3 mm to about 6.5 mm (e.g., from about 0.125 to about 0.25 inches).

The apparatus 100 further comprises a heating device 150 disposed around the perimeter of the capsule 160, such that the temperature of the capsule 160 can be raised or lowered in a uniform manner. The heating device is not particularly limited and may be chosen to meet a particular need or intended use. In certain embodiments, the heating device 150 include at least one resistively heated tube, foil, ribbon, bar, wire, or combinations thereof. Optionally, the apparatus 100 may comprise a cooling system, for example, a recirculating system comprising water, a water/anti-freeze solution, oil, or the like. A cooling system helps to maintain the high strength enclosure 110 at a temperature where its strength and creep resistance remain high. Cooling may alternatively be provided by passive or forced air convection over the outer surface of the high strength enclosure. It will be appreciated that the radial segments 120, in addition to reducing or diffusing the pressure loading on the reactor system, thermally insulate the pressure vessel 110 from the high temperature near the heater 150 and capsule 160. This allows the pressure vessel 110 to operate at a lower temperature and retain its material properties.

The capsule 160 may be formed from a deformable material to allow expansion of the capsule 160 as pressure increases within the capsule 160. This prevents the capsule 160 from bursting. In one embodiment, the deformable material may comprise at least one of copper, copper-based alloy, gold, silver, palladium, platinum, iridium, ruthenium, rhodium, osmium, titanium, vanadium, chromium, iron, iron-based alloy, nickel, nickel-based alloy, zirconium, niobium, molybdenum, tantalum, tungsten, rhenium, combinations thereof, and the like. In another embodiment, the capsule 160 is formed from a cold-weldable material, such as, but not limited to, at least one of copper, copper-based alloy, gold, silver, palladium, platinum, iridium, ruthenium, rhodium, osmium, iron, iron-based alloy, nickel, nickel-based alloy, molybdenum, and combinations thereof. Iron-base alloys that may be used to form capsule 160 include, but are not limited to, stainless steels. Nickel-base alloys that may be used to form capsule include, but are not limited to, inconel, hastelloy, and the like.

In one embodiment, the capsule is closed, sealed, and substantially free of air prior to insertion in the high pressure apparatus. In the illustrated embodiment, the capsule does not contain a movable plunger, as it is difficult to maintain a chemically inert, air-tight seal. Instead, the capsule has a relatively fixed outer enclosure, such that the capsule changes geometry by expansion and contraction (e.g., deformation) during a particular supercritical fluid process. In one embodiment, the capsule includes a closed end, at least one wall adjoining the closed end and extending therefrom and an airtight sealed end adjoining the at least one wall opposite the closed end. The sealed end is formed after introducing a material into at least one chamber, evacuating the chamber, and introducing a solvent into at least one chamber without substantial exposure to air. An additional outer seal may then be provided to the sealed end by cold welding, arc welding, or the like. Once sealed, the chamber within the capsule is substantially air-free, and the material contained therein can be processed with reduced risk of contamination.

Inside the temperature and pressure regulated environment of the high strength enclosure 110 of FIG. 1, the capsule 160 contains substances, such as a material and a solvent, at least one of which becomes supercritical at high temperatures and high pressures within the capsule 160. In certain cases, embodiments of the disclosed apparatus and methods may be useful for growing crystals or processing material in a fluid that is superheated, that is, at a temperature higher than its boiling point at atmospheric pressure, but not necessarily supercritical. It should be understood that the term "supercritical" may used interchangeably with the term "superheated" for purposes of defining the range of use of embodiments of the present invention. The capsule 160 may be used to process a variety of materials, including high quality gallium nitride single crystals or quartz crystals.

In certain embodiments, the capsule 160 includes at least one dividing structure such as a baffle plate, which divides the capsule 160 into multiple separate chambers, such as a first chamber (e.g. a nutrient chamber) and a second chamber (e.g. a seed/crystal growing chamber). The nutrient chamber contains the at least one material for processing the at least one material at supercritical temperature. The seed/crystal growing chamber or second chamber may be located in the top or the bottom region of the capsule 160 depending on the particular supercritical fluid process, e.g., crystal and growth chemistry, and whether the solubility of the material being processed increases or decreases with temperature. The baffle plate may have a plurality of passageways to facilitate fluid flow, heat transfer, and mass transfer between the multiple separate chambers, e.g., the first chamber and the second chamber. Initially, one or more nutrient materials, such as crystals or polycrystalline particles or nutrient particles, are placed in the first chamber, and one or more seed materials, such as crystal seeds, are placed in the second chamber. In an exemplary crystal growth process, as the internal environment within the capsule 160 becomes supercritical, solute dissolved from the nutrient particles circulates to the crystal seeds, thereby facilitating crystal growth on the seeds within the second chamber. The baffle plate may be configured to confine or separate the nutrient and/or seed materials to a specific region of the capsule 160, while permitting a supercritical fluid along with dissolved solute to migrate throughout the capsule 160 by passing freely through the passageways in the baffle plate.

The heating device may be chosen and configured as desired for a particular purpose or intended use. Although not shown in FIGS. 1 through 5, outer surface 152 of heating device 150 may contain thereon one or more suitable heating elements. In one embodiment, suitable heating elements include electrical heating elements, semiconductor-based heating elements, or a combination of thereof. In one embodiment (not shown), a desired pattern of one or more electrically-driven heater wires are disposed in one or more grooves formed on the outer surface of heating device 150. In one embodiment, the main portion of the heating device is, for example, a cylindrically-shaped boron nitride (HBR grade) tube. HBR boron nitride is an electrical insulator while being thermally conductive in a radial direction. In one embodiment, the one or more grooves formed in the HBR boron nitride support tube are formed via a machining process. However, it should be noted that the present invention is not limited solely to a machining process. Instead, any suitable process for forming the one or more grooves in the HBR boron nitride tube of the present invention can be utilized. Given the above, one or more electrically-driven heater wires are then deposited, placed and/or located on outer surface 152 of heating device 150 in any desired pattern. In one embodiment, a sinulated pattern can be utilized, however, it should be realized that the present invention is not limited thereto. Rather, any pattern can be utilized so long as such a pattern enables one to obtain the desired temperature gradient between the top and bottom of a capsule 160 that is placed within the cavity present in heating device 150.

Figure 5:
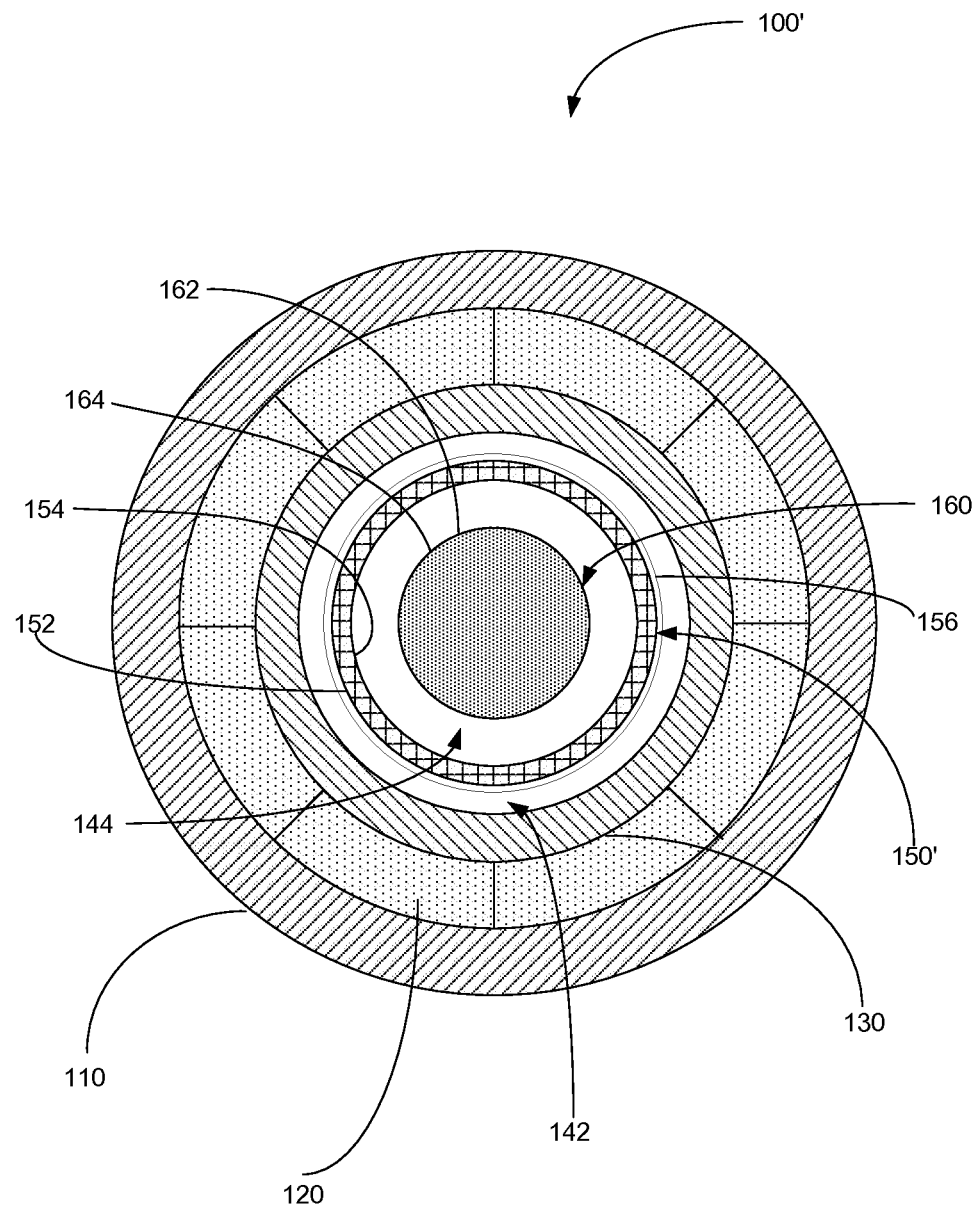
FIG. 5 is a cross-sectional top view of an apparatus in accordance with one embodiment of the invention.

In one embodiment, the outer surface of the heating device may be covered with a thermal insulating material. FIG. 5 illustrates an embodiment of an apparatus 100'. Apparatus 100' is similar to apparatus 100 and comprises a heater 150'. Heater 150' is similar to heater 150 in various aspects, but heater 150' is shown as comprising a thermal insulating sleeve 156 disposed about or covers the outer surface 152 of the heater. In one embodiment, the outer surface 152 of heating device 150' is covered with a pyrolytic boron nitride sleeve 156. The thermal insulating material, such as a pyrolytic boron nitride sleeve, may be disposed about the outer surface after installation of the one or more heating wire patterns. When present, the sleeve acts as an effective insulator and thermal barrier. In another embodiment, the pyrolytic boron nitride sleeve also acts to maintain the location of the one or more heating wires relative the one or more grooves for such in the HBR boron nitride support tube.

In another embodiment, the one or more electrically-driven heater wires can be replaced with any suitable pattern of pyrolytic graphite that is deposited via any suitable technique (e.g., chemical vapor deposition (CVD)) on outer surface 152 of heating device 150. Since various suitable CVD processes are known in the art, a detailed discussion herein is omitted for the sake of brevity. Alternatively, pyrolytic graphite can be deposited over the entire outer surface 152 of heating device 150 via a suitable CVD process. After CVD deposition is complete, a suitable pattern can be formed in the resulting pyrolytic graphite layer via, for example, sandblasting. The remaining pattern of pyrolytic graphite then becomes the "heating wires" in this embodiment. Additionally, in this embodiment the outer surface 152 of heating device 150 is covered with a pyrolytic boron nitride sleeve (not pictured) after completion of the one or more patterns of pyrolytic graphite that form the "heating wires" in this embodiment. In this embodiment, the main portion of heating device is, for example, a cylindrically-shaped boron nitride (HBR grade) tube.

While the invention has been described with reference to various exemplary embodiments, it will be appreciated that modifications may occur to those skilled in the art, and the present application is intended to cover such modifications and inventions as fall within the spirit of the invention. In addition, while a particular feature of the invention may have been described above with respect to only one or more of several illustrated embodiments, such feature may be combined with one or more other features of the other embodiments, as may be desired and advantageous for any given or particular application.

We claim:

1. An apparatus comprising:
   a high strength enclosure;
   a plurality of high strength radial segments disposed adjacent to and radially inward from the high strength enclosure;
   a liner disposed adjacent to and radially inward from the high strength radial segments, the liner comprising one of a high temperature steel or a high temperature metal alloy;
   a chamber that is defined by an inner surface of the liner;
   a heating device disposed within the chamber, the heating device having an outer surface and an inner surface, and defining a cavity radially inward from the inner surface; and
   a capsule for growing crystals therein under high temperature and pressure conditions, the capsule being disposed within the cavity of the heating device, and holding reactants and materials, wherein
   a first gap is disposed between the liner and the outer surface of the heating device and the inner surface of the liner,
   the first gap is configured to be filled with a high-pressure gas, and the capsule is configured such that there is a second gap between an exterior surface of the capsule and the inner surface of the heating device, and the second gap between the exterior surface of the capsule and the inner surface of the heating device being configured to be filled with a high-pressure gas.

2. The apparatus of claim 1, wherein the liner comprises a nickel-chromium based super alloy.

3. The apparatus of claim 1, where the liner has a thickness of about 0.1 mm to 10 mm.

4. The apparatus of claim 1, wherein the high strength radial segments comprise a material chosen from a ceramic, a refractory metal, a cement, or a combination of two or more thereof.

5. The apparatus of claim 1, wherein the high strength radial segments comprise a material chosen from alumina, silicon nitride, silicon carbide, zirconia, tungsten, molybdenum, cobalt-cemented tungsten carbide, or a combination of two or more thereof.

6. The apparatus of claim 1, wherein the high strength radial segments have a wedge shaped structure.

7. The apparatus of claim 1, comprising a pressure control device configured to adjust (a) a pressure within the capsule, or (b) a surrounding pressure of a pressurized gas within the high strength enclosure in response to sensed environmental conditions within the capsule or high strength enclosure.

8. The apparatus of claim 7 comprising a sensor configured to sense a pressure difference between an interior and an exterior of the capsule.

9. The apparatus of claim 8, where the capsule has a first coefficient of thermal expansion, the sensor has a second coefficient of thermal expansion, and the second coefficient of thermal expansion is within 35% of the first coefficient of thermal expansion.

10. The apparatus of claim 8, wherein the sensor physically engages the capsule.

11. The apparatus of claim 8, wherein the capsule comprises a lid, and the lid is configured such that it has a first region having a first thickness, a second region having a second thickness that is less than the first thickness.

12. The apparatus of claim 11, wherein the sensor is disposed on the lid of the capsule such that it overlies at least a portion of the second region having the second thickness.

13. The apparatus of claim 7, comprising a displacement sensor configured to measure deformation of the capsule due to a pressure difference between an interior pressure of the capsule and a surrounding pressure.

14. The apparatus of claim 1, wherein a sleeve is disposed about the outer surface of the heating device.

15. The apparatus of claim 14, wherein the sleeve comprises a thermal insulating material.

16. The apparatus of claim 15, wherein sleeve comprises pyrolytic boron nitride.

17. An apparatus comprising: a high strength enclosure;
a plurality of high strength radial segments disposed adjacent to and radially inward from the high strength enclosure, wherein
the high strength radial segments comprise a material chosen from a ceramic, a refractory metal, a cement, or a combination of two or more thereof;
a liner disposed adjacent to and radially inward from the high strength radial segments;
a chamber that is defined by an inner surface of the liner;
a heating device disposed within the chamber, the heating device having an outer surface an inner surface, and defining a cavity radially inward from the inner surface; and
a capsule for growing crystals therein under high temperature and pressure conditions, the capsule being disposed within the cavity of the heating device, and holding reactants and materials, wherein
a first gap is disposed between the liner and the outer surface of the heating device,
a second gap is disposed between an exterior surface of the capsule and the inner surface of the heating device, and
the first gap and the second gap are configured to be filled with a high-pressure gas.

18. The apparatus of claim 17 where the liner comprises a high temperature steel or a high temperature metal alloy.

19. The apparatus of claim 18 where in the liner comprises a nickel-chromium based super alloy.

20. The apparatus of claim 17, where the liner has a thickness of about 0.1 mm to 10 mm.

21. The apparatus of claim 17, wherein the high strength radial segments comprise a material chosen from alumina, silicon nitride, silicon carbide, zirconia, tungsten, molybdenum, cobalt-cemented tungsten carbide, or a combination of two or more thereof.

22. The apparatus of claim 17, wherein the high strength radial segments have a wedge shaped structure.

23. The apparatus of claim 17, comprising a pressure control device configured to adjust (a) a pressure within the capsule, or (b) a surrounding pressure of a pressurized gas within the high strength enclosure in response to sensed environmental conditions within the capsule or high strength enclosure.

24. The apparatus of claim 23 comprising a sensor configured to sense a pressure difference between an interior and an exterior of the capsule.

25. The apparatus of claim 24, where the capsule has a first coefficient of thermal expansion, the sensor has a second coefficient of thermal expansion, and the second coefficient of thermal expansion is within 35% of the first coefficient of thermal expansion.

26. The apparatus of claim 24, wherein the sensor physically engages the capsule.

27. The apparatus of claim 24, wherein the capsule comprises a lid, and the lid is configured such that it has a first region having a first thickness, and a second region having a second thickness that is less than the first thickness.

28. The apparatus of claim 27, wherein the sensor is disposed on the lid of the capsule such that it overlies at least a portion of the second region having the second thickness.

29. The apparatus of claim 17, comprising a displacement sensor configured to measure deformation of the capsule due to a pressure difference between an interior pressure of the capsule and a surrounding pressure.

30. The apparatus of claim 18, wherein a sleeve is disposed about the outer surface of the heating device.

31. The apparatus of claim 30, wherein the sleeve comprises a thermal insulating material.

32. The apparatus of claim 31, wherein sleeve comprises pyrolytic boron nitride.

33. The apparatus of claim 1, wherein the apparatus is configured to increase the operating condition within the capsule to a pressure of about 5 kbar or greater and a temperature of about 550° C. or greater.

34. The apparatus of claim 1 comprising a gallium nitride crystal, wherein the gallium nitride crystal is grown in super critical ammonia.

35. A method of growing a crystal, comprising reacting a seed crystal and a nutrient material under temperature and pressure conditions sufficient to facilitate crystal growth, where the method is conducted in an apparatus of claim 1.

36. The method of claim 35, comprising reacting the seed crystal and nutrient at a temperature of about 550° C. or greater and a pressure of about 5 kbar or greater.

37. The apparatus of claim 1, wherein the liner has a cylindrical shape and two opposing ends, and the apparatus further comprises:

end caps that are disposed at the two opposing ends of the liner to form a sealed environment surrounding the heating device and the capsule.

\* \* \* \* \*